(12) United States Patent
Potasek et al.

(10) Patent No.: US 11,768,121 B2
(45) Date of Patent: Sep. 26, 2023

(54) PRESSURE SENSOR WITH TRIM RESISTORS

(71) Applicant: Rosemount Aerospace Inc., Burnsville, MN (US)

(72) Inventors: David P. Potasek, Lakeville, MN (US); Robert Stuelke, Minneapolis, MN (US)

(73) Assignee: ROSEMOUNT AEROSPACE INC., Burnsville, MN (US)

( * ) Notice: Subject to any disclaimer, the term of this patent is extended or adjusted under 35 U.S.C. 154(b) by 22 days.

(21) Appl. No.: 17/532,687

(22) Filed: Nov. 22, 2021

(65) Prior Publication Data
US 2023/0160767 A1 May 25, 2023

(51) Int. Cl.
*G01L 9/06* (2006.01)
*G01L 19/06* (2006.01)
*G01R 27/08* (2006.01)

(52) U.S. Cl.
CPC .............. *G01L 9/065* (2013.01); *G01R 27/08* (2013.01)

(58) Field of Classification Search
CPC ... G01L 9/00; G01L 9/06; G01L 9/065; G01L 9/08; G01L 19/00; G01L 19/06; G01L 19/14; G01R 27/08
See application file for complete search history.

(56) References Cited

U.S. PATENT DOCUMENTS

| | | | |
|---|---|---|---|
| 4,462,018 A | 7/1984 | Yang et al. | |
| 4,465,075 A | 8/1984 | Swartz | |
| 5,088,329 A | 2/1992 | Sahagen | |
| 6,700,473 B2 | 3/2004 | Kurtz et al. | |
| 6,889,554 B2 | 5/2005 | Hirota et al. | |
| 6,957,584 B2 | 10/2005 | Jackson | |
| 9,003,897 B2 * | 4/2015 | Wade | G01L 1/18 73/862.623 |
| 9,261,425 B2 | 2/2016 | Fahimi et al. | |
| 9,423,315 B2 | 8/2016 | Fahimi et al. | |

(Continued)

FOREIGN PATENT DOCUMENTS

| | | | | |
|---|---|---|---|---|
| CN | 112414594 A | | 2/2021 | |
| CN | 112414594 B | * | 4/2022 | ........... G01L 1/2281 |
| DE | 10156951 A1 | * | 5/2003 | ............. G01L 9/065 |

OTHER PUBLICATIONS

Partial European Search Report dated Apr. 13, 2023, received for corresponding European Application No. 22208879.1, p. 14.

(Continued)

*Primary Examiner* — Nguyen Q. Ha
(74) *Attorney, Agent, or Firm* — Kinney & Lange, P.A.

(57) ABSTRACT

A pressure sensor includes a Wheatstone bridge circuit including a first resistor, a second resistor, a third resistor, and a fourth resistor having matching output characteristics. The pressure sensor further includes a first trim resistor in series with the Wheatstone bridge circuit, wherein the first trim resistor has output characteristics matching the output characteristics of the first resistor, the second resistor, the third resistor, and the fourth resistor of the Wheatstone bridge. The pressure sensor additionally includes a second trim resistor in parallel or a parallel loop with the Wheatstone bridge circuit, wherein the second trim resistor has output characteristics matching the output characteristics of the first resistor, the second resistor, the third resistor, and the fourth resistor of the Wheatstone bridge.

20 Claims, 6 Drawing Sheets

(56) References Cited

U.S. PATENT DOCUMENTS

| | | |
|---|---|---|
| 9,709,452 B2 | 7/2017 | Norian et al. |
| 10,215,651 B2 | 2/2019 | Hilton |
| 10,337,942 B2 | 7/2019 | Stewart |
| 10,861,665 B1 | 12/2020 | Backman et al. |
| 10,998,113 B2 | 5/2021 | Potasek |
| 11,092,504 B2 | 8/2021 | Daup et al. |
| 11,099,093 B2 | 8/2021 | Potasek et al. |
| 2005/0109935 A1* | 5/2005 | Manlove ........... B60R 21/01516 250/300 |
| 2007/0159293 A1 | 7/2007 | Landsberger et al. |
| 2013/0298688 A1 | 11/2013 | Wade et al. |
| 2021/0131898 A1 | 5/2021 | Botker et al. |
| 2022/0316971 A1 | 10/2022 | Potasek et al. |

OTHER PUBLICATIONS

Bridge Configurations for Pressure Sensors, Mar. 6, 2018, Merit Sensor, p. 9.

* cited by examiner

PRESSURE SENSOR WITH TRIM RESISTORS

BACKGROUND

The present disclosure relates to pressure sensors, and in particular, to a pressure sensor with a trim die.

A pressure sensor is configured to measure the pressure of a fluid. Pressure sensors can be absolute pressure sensors that measure a pressure of a first fluid compared to a reference pressure (typically a vacuum). Pressure sensors can also be differential pressure sensors that measure a difference in pressure between a first fluid and a second fluid. Pressure sensors can measure pressure in a variety of ways. For example, a pressure sensor can have one or more diaphragms that deform based on the pressure of a first fluid and/or a second fluid and one or more piezoresistive strain gauge sensors on the diaphragms can measure the strain in the diaphragms caused by the deformation of the diaphragms.

A pressure sensor can include piezoresistors arranged in a Wheatstone bridge configuration. The piezoresistors are configured such that each individual piezoresistor changes in different directions in response to an applied pressure. The change in resistance can be measured to determine the change in pressure.

SUMMARY

A pressure sensor includes a Wheatstone bridge circuit including a first resistor, a second resistor, a third resistor, and a fourth resistor having matching output characteristics. The pressure sensor further includes a first trim resistor in series with the Wheatstone bridge circuit, wherein the first trim resistor has output characteristics matching the output characteristics of the first resistor, the second resistor, the third resistor, and the fourth resistor of the Wheatstone bridge. The pressure sensor additionally includes a second trim resistor in parallel or a parallel loop with the Wheatstone bridge circuit, wherein the second trim resistor has output characteristics matching the output characteristics of the first resistor, the second resistor, the third resistor, and the fourth resistor of the Wheatstone bridge.

A pressure sensor includes a Wheatstone bridge circuit including a first resistor, a second resistor, a third resistor, and a fourth resistor having matching output characteristics. The pressure sensor further includes a first trim resistor electrically coupled to the Wheatstone bridge circuit, wherein the first trim resistor has output characteristics matching the output characteristics of the first resistor, the second resistor, the third resistor, and the fourth resistor of the Wheatstone bridge. The pressure sensor additionally includes a second trim resistor electrically coupled to the Wheatstone bridge circuit, wherein the second trim resistor has output characteristics that are mismatched to the output characteristics of the first resistor, the second resistor, the third resistor, and the fourth resistor of the Wheatstone bridge.

A pressure sensor includes a first sensor portion having a pressure die with piezoresistors located in a Wheatstone bridge configuration, and a second sensor portion having a trim die with a first trim resistor positioned on the trim die. The pressure die in the first sensor portion is electrically coupled to the trim die in the second sensor portion. The first sensor portion and the second portion are positioned apart from one another.

DETAILED DESCRIPTION

Figure 1:
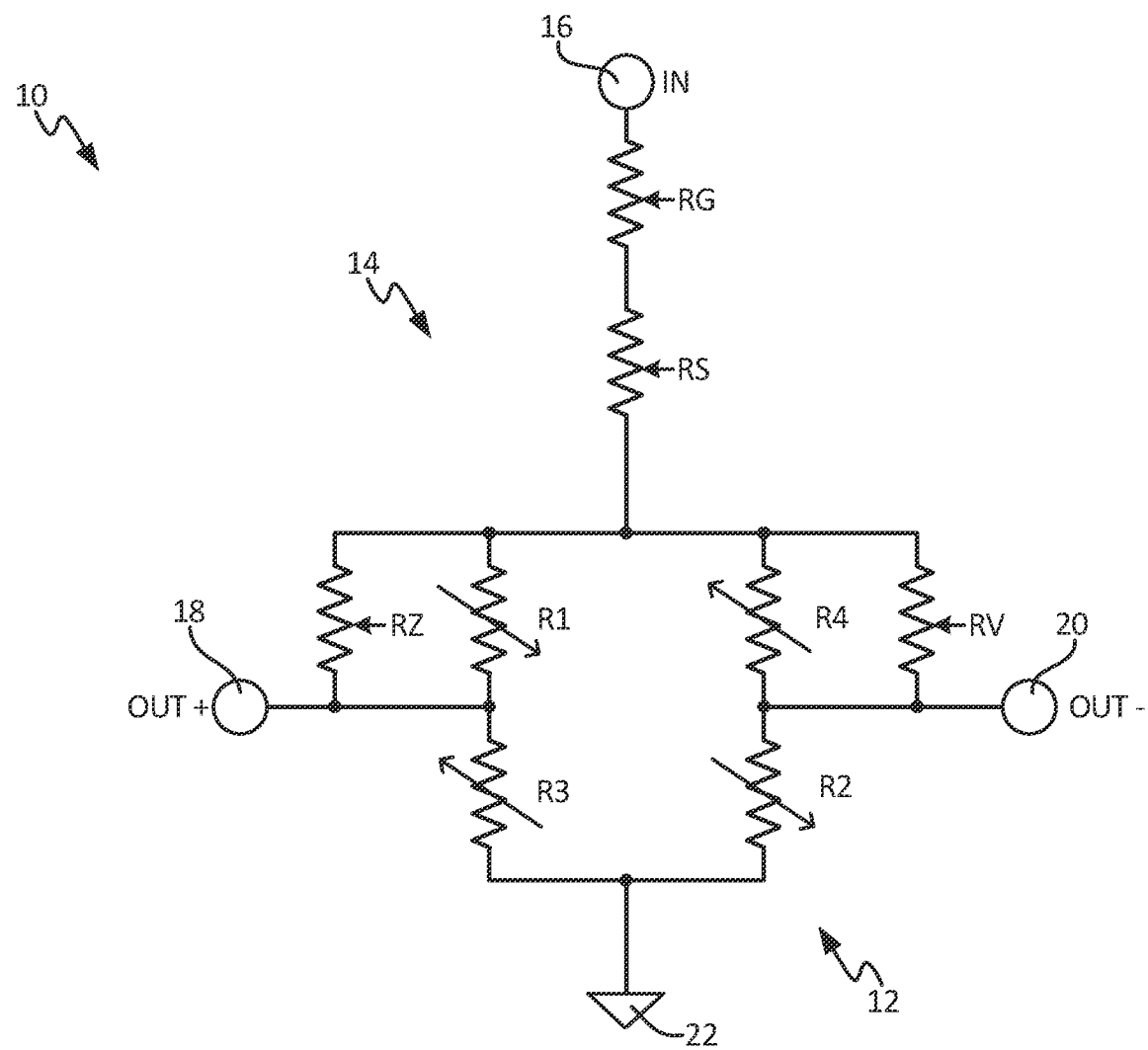
FIG. 1 is a circuit diagram of a pressure sensor including a Wheatstone bridge and trim resistors.
Figure 2:
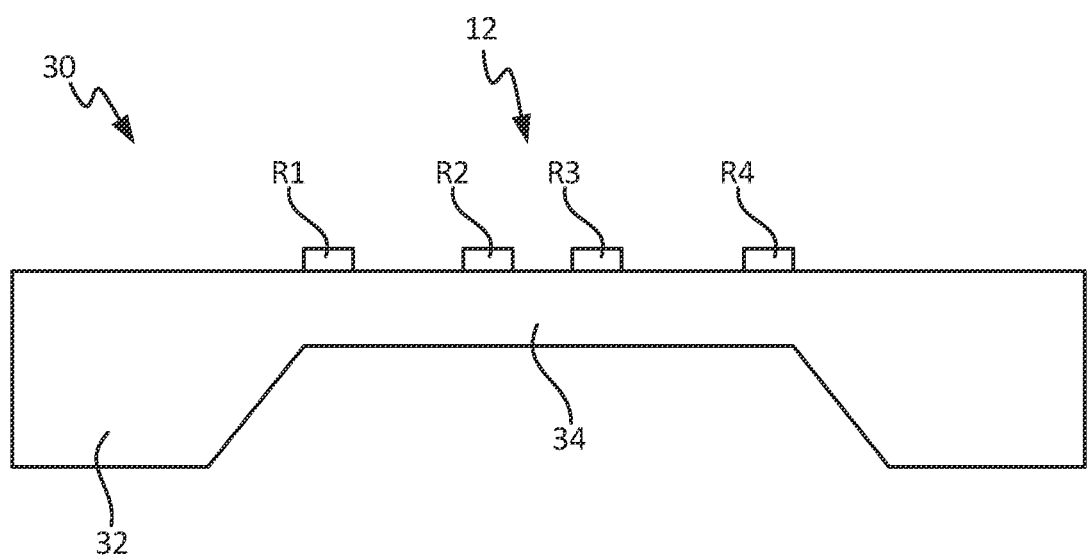
FIG. 2 is a side view of a first embodiment of a diaphragm wafer of the pressure sensor.

FIG. 1 is a circuit diagram of pressure sensor 10 including Wheatstone bridge 12 and trim resistors 14. FIG. 2 is a side view of diaphragm wafer 30 of pressure sensor 10. FIGS. 1-2 will be discussed together. FIG. 1 shows pressure sensor 10, including Wheatstone bridge 12, trim resistors 14, input voltage terminal 16, positive voltage terminal 18, negative voltage terminal 20, and ground 22. Wheatstone bridge 12 includes resistor R1, resistor R2, resistor R3, and resistor R4 (referred to collectively as resistors R1-R4). Trim resistors 14 include resistor RG, resistor RS, resistor RZ, and resistor RV. FIG. 2 shows diaphragm wafer 30 having outer portion 32 and diaphragm 34, and Wheatstone bridge 12.

A circuit diagram of pressure sensor 10 is shown in FIG. 1. Pressure sensor 10 can be a high temperature pressure sensor. Pressure sensor 10 includes Wheatstone bridge 12 that forms a sensing portion of pressure sensor 10. Wheatstone bridge 12 includes resistor R1, resistor R2, resistor R3, and resistor R4. Pressure sensor 10 also includes trim resistors 14 positioned in series and in parallel with Wheatstone bridge 12. Trim resistors 14 include resistor RG, resistor RS, resistor RZ, and resistor RV. Resistor RG and resistor RS are positioned in series with Wheatstone bridge 12, and resistor RZ and resistor RV are positioned in parallel with Wheatstone bridge 12.

Pressure sensor 10 include input voltage terminal 16 that is electrically coupled to a voltage source (not shown in FIG. 1). Input voltage terminal 16 receives a voltage from the voltage source. Pressure sensor 10 also includes positive output terminal 18 and negative output terminal 20. A sensing device is electrically coupled to positive output terminal 18 and negative output terminal 20 to receive a signal from Wheatstone bridge 12. Pressure sensor 10 also includes ground 22.

Wheatstone bridge 12 includes resistor R1, resistor R2, resistor R3, and resistor R4 arranged in a bridge circuit with resistor R1 and resistor R3 on a first leg of the bridge and resistor R2 and resistor R4 on a second leg of the bridge. Resistor RG and resistor RS of trim resistors 14 are arranged in series with resistor R1, resistor R2, resistor R3, and resistor R4 of Wheatstone bridge 12. Resistor RZ of trim resistors 14 is arranged in parallel with resistor R1 of Wheatstone bridge 12. Resistor RV of trim resistors 14 is arranged in parallel with resistor R4 of Wheatstone bridge 12.

A voltage is input into the circuit at input voltage terminal 16. Input voltage terminal 16 is arranged in series with resistor RG and resistor RS. Current flows from input voltage terminal 16 through resistor RG and resistor RS. The current is then split between resistor R1 and resistor R3 of Wheatstone bridge 12, resistor RZ, and resistor RV. The currents flowing through resistor R1 and resistor RZ will then flow through resistor R3 to ground 22. The currents flowing through resistor R4 and resistor RV will then flow through resistor R2 to ground 22. The output of pressure sensor 10 can be measured as an output voltage between positive output terminal 18 and negative output terminal 20.

Wheatstone bridge 12 is an electrical circuit known in the art used in resistive based sensors. Resistors R1-R4 of Wheatstone bridge 12 are positioned on diaphragm wafer 30, shown in FIG. 2. Diaphragm wafer 30 includes outer portion 32 and diaphragm 34. Outer portion 32 supports diaphragm 34, which is configured to deflect under pressure. Resistors R1-R4 are piezoresistors formed on diaphragm 34 and a voltage is applied across Wheatstone bridge 12. Upon an input of pressure, diaphragm 34 will deform and cause the surface of diaphragm 34 to undergo a mechanical strain. The resistance of each of resistor R1, resistor R2, resistor R3, and resistor R4 will experience a change in resistance in response to the induced mechanical strain in diaphragm 34. The change in resistance will cause the output voltage being sensed at positive output terminal 18 and negative output terminal 20 to change in accordance with the change in resistance. This change in output voltage can be used to determine the pressure being applied to diaphragm 34.

Wheatstone bridge 12 is configured such that the individual resistors R1-R4 change in different directions in response to the applied pressure. Resistors R1-R4 are made out of the same material and have the same thickness so they have the same output characteristics, however two of resistors R1-R4 are oriented such that the resistance increases with applied pressure and the other two of resistors R1-R4 are oriented such that the resistance decreases with applied pressure. The nominal voltage output of Wheatstone bridge 12 when no pressure is applied can be referred to as Vnull. When no pressure is applied, the nominal voltage output (Vnull) should be a known set value, which is typically zero. However, variations in the processes used to manufacture resistors R1-R4 and Wheatstone bridge 12 can cause variation in the nominal voltage output (Vnull) of Wheatstone bridge 12. The amount of voltage that changes with applied full scale pressure is referred to as span. Variations in the processes used to manufacture diaphragm wafer 30, and specifically variations in the thickness of diaphragm 34, can cause variations in span. When diaphragm wafer 34 is assembled in a sensor package, the assembly process can also cause variations in the nominal voltage output (Vnull) and span.

The piezoresistive effect in Wheatstone bridge 12 is responsible for the large change in resistance proportional to diaphragm 34 strain that allows Wheatstone bridge 12 to accurately sense slight changes in pressure. The piezoresistive effect is temperature sensitive and causes the span to change with temperature, which can be referred to as the span temperature coefficient (STC). Wheatstone bridge 12 is useful in that common mode changes in resistance, such as resistance temperature sensitivity, is rejected. However, in practice there is some temperature sensitivity that is not common mode and changes the output of Wheatstone bridge 12 with temperature, which can be referred as the zero temperature coefficient (ZTC).

The materials that are used for diaphragm 34 and Wheatstone bridge 12 of pressure sensor 10 are selected to be sensitive to strain. Resistors R1-R4 will experience a large change in resistance with a small pressure change due to the sensitivity of the materials. This allows pressure sensor 10 to accurately sense slight changes in pressure, but it is also makes pressure sensor 10 susceptible to changes to the nominal voltage output (Vnull), span, span temperature coefficient (STC), and zero temperature coefficient (ZTC) based on variations caused by manufacturing and assembly. The nominal voltage output (Vnull), span, span temperature coefficient (STC), and zero temperature coefficient (ZTC) can be considered the sensor characteristics of pressure sensor 10.

Applications of Wheatstone bridge 12 require fixed voltage outputs at zero pressure (Vzero) and at full scale pressure (Vfullscale) with a linear correlation between pressure in and voltage out between the voltage output at zero pressure (Vzero) and at full scale pressure (Vfullscale). Trim resistors 14 are used to transform the sensor characteristics (nominal voltage output (Vnull), span, span temperature coefficient (STC), and zero temperature coefficient (ZTC)) of pressure sensor 10, which vary with process variation, into the fixed outputs that applications of Wheatstone bridge 10 require. Trim resistors 14 can be trimmed, for example by laser ablation, fuse blowing, diode blowing, by selecting precise discrete component values from an array of possible choices, or another suitable trimming process, to attenuate, or change, the sensor characteristics to correct for the variations caused by the process variations.

To correct for the four sensor characteristics, a minimum of four trim resistors 14 are needed. Resistor RG and resistor RS are trimmed to change the voltage being delivered to Wheatstone bridge 12 and thus affect the span of Wheatstone bridge 12. Resistor RG changes the span, and resistor RS compensates for temperature variations of span, thus affecting the span temperature coefficient (STC). Resistor RV and resistor RZ are trimmed to change the nominal voltage output (Vnull) of Wheatstone bridge 12. When no pressure is being applied to pressure sensor 10, the nominal voltage output (Vnull) should be zero. Resistor RV changes the nominal voltage output (Vnull), and resistor RZ compensates for temperature variations of the nominal voltage output (Vnull), thus affecting the zero temperature coefficient (ZTC).

Resistor RG is matched to and has the same output characteristics as resistors R1-R4 of Wheatstone bridge 12. Specifically, resistor RG has the same temperature coefficient of resistance as resistors R1-R4 of Wheatstone bridge 12. Resistor RG can be trimmed to change the span of Wheatstone bridge 12. Because resistor RG has the same temperature coefficient of resistance as resistors R1-R4 of Wheatstone bridge 12, resistor RG changes the voltage going into Wheatstone bridge 12 at all temperatures. This allows resistor RG to be trimmed to change the span of Wheatstone bridge 12 without introducing temperature sensitivity into Wheatstone bridge 12. Resistor RG can be matched to resistors R1-R4 in any suitable manner. For example, resistor RG can be manufactured out of the same materials and using the same manufacturing processes as are used to manufacture resistors R1-R4 to match resistor RG to resistors R1-R4.

Resistor RS is a trim resistor that is purposely not matched to and has different output characteristics than resistors R1-R4 of Wheatstone bridge 12. Specifically, resistor RS has a lower temperature coefficient of resistance than resistors R1-R4 of Wheatstone bridge 12. Resistor RS can be trimmed to temperature compensate the span of Wheatstone bridge 12. Because resistor RS has a different temperature coefficient of resistance than resistors R1-R4 of Wheatstone bridge 12, resistor RS temperature compensates the voltage going into Wheatstone bridge 12. If the resistance of Wheatstone bridge 12 increases in resistance due to an increase in temperature, resistor RS can be designed to decrease in resistance due to an increase in temperature to temperature compensate the span of Wheatstone bridge 12. Alternatively, resistor RS can be designed to have low to no temperature sensitivity to temperature compensate the span of Wheatstone bridge 12.

Resistor RV is matched to and has the same output characteristics as resistors R1-R4 of Wheatstone bridge 12. Specifically, resistor RV has the same temperature coefficient of resistance as resistors R1-R4 of Wheatstone bridge 12. Resistor RV can be trimmed to change the nominal voltage output (Vnull) of Wheatstone bridge 12. Because resistor RV has the same temperature coefficient of resistance as resistors R1-R4 of Wheatstone bridge 12, resistor RV will change the voltage going into Wheatstone bridge 12 at the same level at all temperatures. This allows resistor RV to be trimmed to change the nominal voltage output (Vnull) of Wheatstone bridge 12 without introducing temperature sensitivity into Wheatstone bridge 12. In the embodiment shown in FIG. 1, resistor RV is parallel with resistor R4, and will thus effectively change resistor R4 to change the nominal voltage output (Vnull). In alternate embodiments, resistor RV can be parallel to resistor R1, resistor R2, resistor R3, or resistor R4 in Wheatstone bridge 12. Resistor RV can be matched to resistors R1-R4 in any suitable manner. For example, resistor RV can be manufactured out of the same materials and using the same manufacturing processes as are used to manufacture resistors R1-R4 to match resistor RV to resistors R1-R4.

Resistor RZ is a trim resistor that is purposely not matched to and has different output characteristics than resistors R1-R4 of Wheatstone bridge 12. Specifically, resistor RZ has a lower temperature coefficient of resistance than resistors R1-R4 of Wheatstone bridge 12. Resistor RZ can be trimmed to temperature compensate the nominal voltage output (Vnull) of Wheatstone bridge 12. Because resistor RZ has a different temperature coefficient of resistance than resistors R1-R4 of Wheatstone bridge 12, resistor RZ temperature compensates the nominal voltage output (Vnull) of Wheatstone bridge 12. If the resistance of Wheatstone bridge 12 increases in resistance due to an increase in temperature, resistor RZ can be designed to decrease in resistance due to an increase in temperature to temperature compensate the nominal voltage output (Vnull) of Wheatstone bridge 12. Alternatively, resistor RZ can be designed to have low to no temperature sensitivity to temperature compensate the nominal voltage output (Vnull) of Wheatstone bridge 12. In the embodiment shown in FIG. 1, resistor RZ is parallel with resistor R1, and will thus effectively introduce temperature sensitivity into resistor R1 to temperature compensate the nominal voltage output (Vnull). In alternate embodiments, resistor RZ can be parallel to any of resistor R1, resistor R2, resistor R3, or resistor R4 in Wheatstone bridge 12.

The embodiment of pressure sensor 10 shown in FIG. 1 is one example of a circuit diagram for pressure sensor 10. In alternate embodiments, trim resistors 14 can be positioned in different locations in the circuit and each trim resistor 14 shown in FIG. 1 can include one or more resistors in alternate embodiments. For example, resistor RV and resistor RZ are typically much bigger than resistors R1-R4 and a t-network can be used with the lower resistance components. When used in a t-network, resistor RV and resistor RZ are each in a parallel loop with one of resistors R1-R4 of Wheatstone bridge 12.

Traditionally, trim resistors are discrete components that are selected from an inventory and soldered to a board. When discrete components like that are used, thousands of discrete components are needed to be stored in inventory to properly trim Wheatstone bridge 10. Further, the use of discrete components provides less control, as it is difficult to match the passive components to Wheatstone bridge 12. Manufacturing trim resistors 14 according to the present disclosure eliminates the need for an inventory of thousands of discrete components. Further, trim resistors 14 can be matched to Wheatstone bridge 12, which allows for greater control when attenuating and temperature compensating Wheatstone bridge 12.

Trim resistors 14 can be included on the same die as Wheatstone bridge 12 or on a separate trim die, discussed below with respect to FIGS. 3-4.

Figure 3:
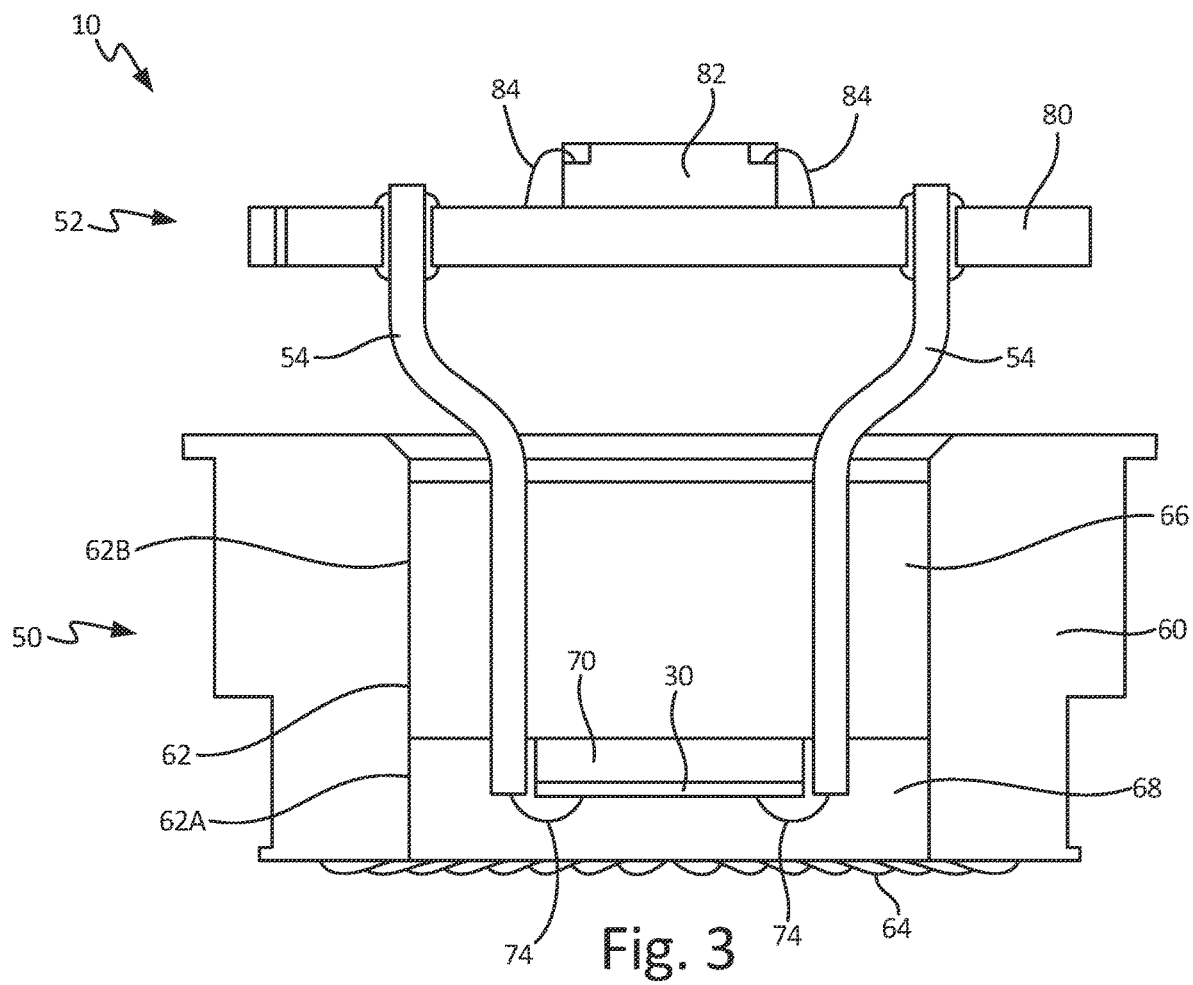
FIG. 3 is a cross-sectional view of the pressure sensor.
Figure 4:
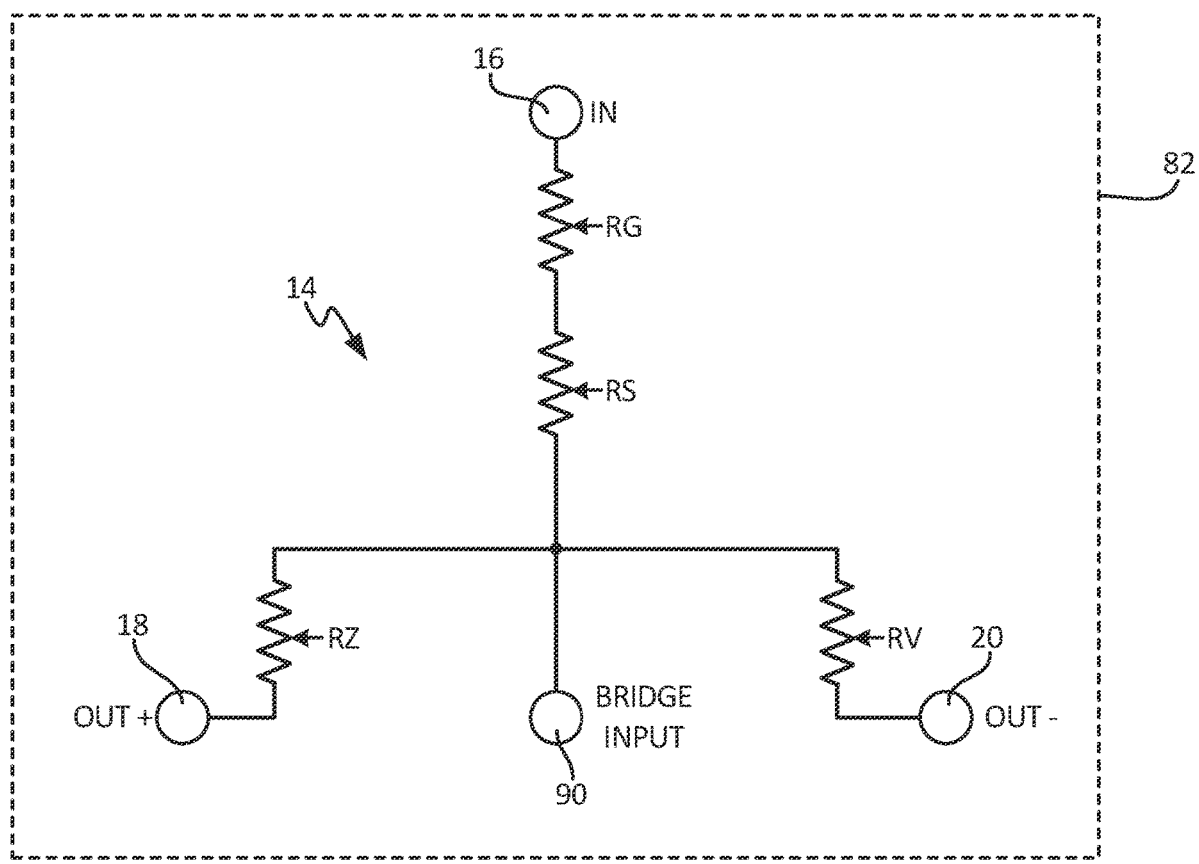
FIG. 4 is a circuit diagram of a trim die of the pressure sensor.

FIG. 3 is a cross-sectional view of pressure sensor 10. FIG. 4 is a circuit diagram of trim die 82 of pressure sensor 10. FIGS. 3-4 will be discussed together. FIG. 3 shows pressure sensor 10 that includes first sensor portion 50, second sensor portion 52, and feedthroughs 54. First sensor portion 50 includes housing 60, cavity 62 (which includes first cavity portion 62A and second cavity portion 62B), isolator 64, filler material 66, pressure transfer fluid 68, pressure die 70 (which includes diaphragm wafer 30), and wire bonds 74. Second sensor portion 52 includes trim board 80, trim die 82, and wire bonds 84. FIG. 4 shows trim die 82 that includes trim resistors 14, input voltage terminal 16, positive voltage terminal 18, negative voltage terminal 20, and bridge terminal 90. Trim resistors 14 include resistor RG, resistor RS, resistor RZ, and resistor RV.

Pressure sensor 10 includes first sensor portion 50 that forms a sensing portion of pressure sensor 10 and second sensor portion 52 that forms a trim portion of pressure sensor 10. Second sensor portion 52 is positioned away from first sensor portion 50. Feedthroughs 54 extend between first sensor portion 50 and second sensor portion 52.

First sensor portion 50 includes housing 60 that forms a body portion of first sensor portion 50. Cavity 62 is formed in housing 60 and extends from a first end to a second end of housing 60. Cavity 62 includes first cavity portion 62A extending from a first end of housing 60, and second cavity portion 62B extending from first cavity portion 62A to a second end of housing 60. Isolator 64 is positioned on the first end of housing 60 over a first end of cavity 62. Filler material 66 is positioned in second cavity portion 62B of cavity 62. Filler material 66 can be a glass seal in one embodiment. Pressure transfer fluid 68 is positioned in first cavity portion 62A of cavity 62 between isolator 64 and filler material 66. Pressure transfer fluid 68 can be oil in one embodiment.

Pressure die 70 is positioned in first cavity portion 62A of cavity 62. Pressure die 70 is positioned on filler material 66. Pressure die 70 includes diaphragm wafer 30. Feedthroughs 54 extend through filler material 66 in second cavity portion 62B and into pressure transfer fluid 68 in first cavity portion 62A. Wire bonds 74 extend between and electrically couple pressure die 70 to feedthroughs 54. Pressure die 70 is hermetically sealed in first sensor portion 50 of pressure sensor 10 between isolator 64 and filler material 66.

Second sensor portion 52 includes trim board 80 that forms a base of second sensor portion 52. Trim die 82 is positioned on trim board 80. Wire bonds 84 extend between and electrically couple trim die 82 to trim board 80. Trim die 82 includes trim resistors 14, input voltage terminal 16, positive voltage terminal 18, and negative voltage terminal 20, as shown in FIG. 4. Trim resistors 14 include resistor RG, resistor RS, resistor RZ, and resistor RV. Resistor RG, resistor RS, resistor RZ, and resistor RV have the same characteristics as discussed above with respect to FIG. 1. Trim die 82 further includes bridge terminal 90, which can be electrically coupled to pressure die 70 by feedthroughs 54.

Resistors R1-R4 of Wheatstone bridge 12 (shown in FIGS. 1-2) are positioned on diaphragm wafer 30 of pressure die 70. Pressure die 70 is positioned in first cavity portion 62A of cavity 62 in housing 60 and surrounded with pressure transfer fluid 68. As discussed above with respect to FIGS. 1-2, variations in the sensor characteristics of resistors R1-R4 of Wheatstone bridge 12 can be caused due to the manufacturing and assembly of pressure sensor 10. When first sensor portion 50 of pressure sensor 10 is fully assembled, resistors R1-R4 are inaccessible, as they are enclosed in and hermetically sealed in first cavity portion 62A of cavity 62 of housing 60. This prevents resistors R1-R4 from being able to be directly trimmed to compensate for variations caused by the assembly of first sensor portion 50 of pressure sensor 50. Further, if trim resistors were positioned directly on pressure die 70, they would also be inaccessible when first sensor portion 50 of pressure sensor 10 is fully assembled and any variation caused by the assembly of first sensor portion 50 could not be compensated for. The design of pressure sensor 10 shown in FIGS. 3-4 resolves this issue, as trim resistors 14 will be accessible after first sensor portion 50 has been fully assembled.

Placing trim resistors 14 on trim die 82 and positioning it away from first sensor portion 50 allows for attenuation and temperature compensation of Wheatstone bridge 14 after first portion 50 has been fully assembled. Trim die 82 is made out the same materials as pressure die 70, for example silicon, oxide, nitride, poly silicon, or nichrome, so that it has the same characteristics as pressure die 70. Trim die 82 can be manufactured according to the same manufacturing process as pressure die 70. This allows resistor RG and resistor RV on trim die 82 to be matched to and have the same output characteristics as resistors R1-R4 of Wheatstone bridge 12. For example, resistor RG and resistor RV can have the same temperature coefficient of resistance as resistors R1-R4. Further, resistor RG and resistor RV can be made out of the same material as, be doped to the same concentration as, and have the same thickness as resistors R1-R4 of Wheatstone bridge 12. Resistor RS and resistor RZ can be purposefully mismatched to and have different output characteristics than resistors R1-R4 of Wheatstone bridge 12. For example, resistor RS and resistor RZ can have different temperature coefficients of resistance than resistors R1-R4 of Wheatstone bridge 12. Trim die 82 can be manufactured using any process that allows the output characteristics of resistor RG and resistor RV to be matched to resistors R1-R4 of Wheatstone bridge 12. Trim resistors 14 on trim die 82 can be trimmed, for example by laser ablation, fuse blowing, diode blowing, or another suitable trimming process.

Manufacturing trim die 82 out of the same materials and according to the same process as pressure die 70 ensures that trim die 82 and pressure die 70 will respond to temperature changes in the same way. Because trim die 82 is manufactured out of the same materials as pressure die 70, it will be sensitive to strain. Trim die 82 is also advantageous, as it can be used to compensate for all four sensor characteristics of Wheatstone bridge 12. Trim die 82 makes it easier and most cost effective to change and temperature compensate Wheatstone bridge 12.

Further, trim die 82 will age in the same way and at the same rate as pressure die 70. As pressure die 70 ages, some variation in the sensor characteristics of Wheatstone bridge 12 can occur. However, if trim die 82 ages in the same way and at the same rate as pressure die 70, it will undergo the same variations and will not impart differences into the sensor characteristics of Wheatstone bridge 12.

FIGS. 5A-6B discussed below show examples of diaphragm wafers and trim wafers that can be positioned on pressure die 70 and trim die 82. The diaphragm wafers and trim wafers are designed to have similar components being made out of similar materials and having similar thicknesses to match the diaphragm wafer and the trim wafer.

Figure 5A:
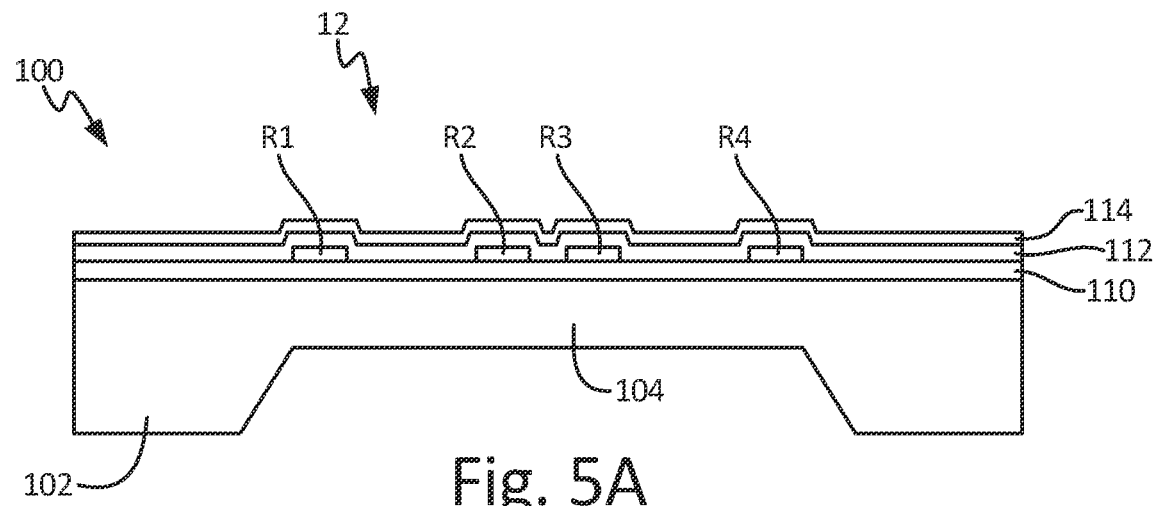
FIG. 5A is a side view of a second embodiment of a diaphragm wafer.
Figure 5B:
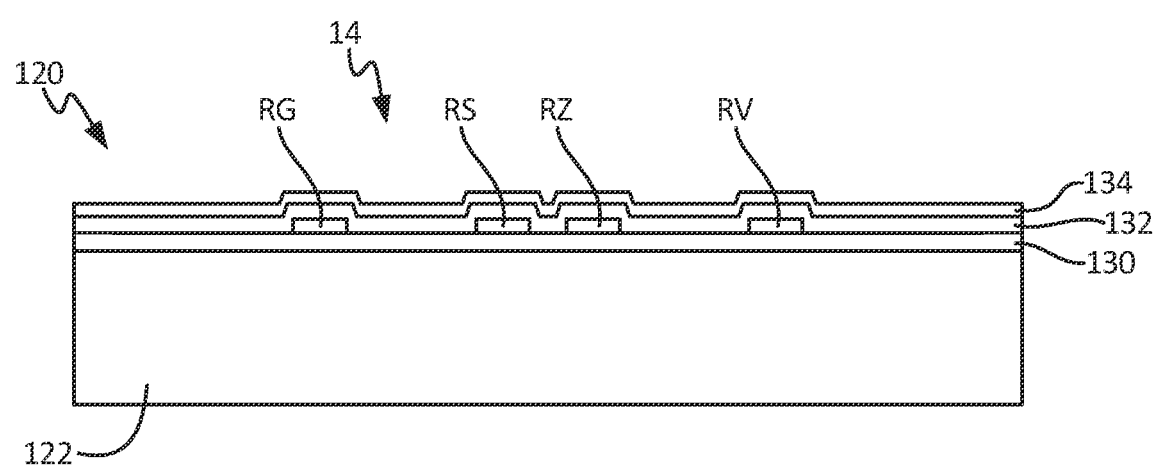
FIG. 5B is a side view of a first embodiment of a trim wafer.

FIG. 5A is a side view of diaphragm wafer 100. FIG. 5B is a side view of trim wafer 120. FIGS. 5A-5B will be discussed together below. FIG. 5A shows Wheatstone bridge 12 (including resistor R1, resistor R2, resistor R3, and resistor R4), diaphragm wafer 100 having outer portion 102 and diaphragm 104, first insulating layer 110, second insulating layer 112, and protection layer 114. FIG. 5B shows trim resistors 14 (including resistor RG, resistor RS, resistor RZ, and resistor RV), trim wafer 120 including wafer portion 122, first insulating layer 130, second insulating layer 132, and protection layer 134.

Diaphragm wafer 100, shown in FIG. 5A, is one embodiment of diaphragm wafer 30 that can form part of pressure die 70 of pressure sensor 10 shown in FIG. 3. Diaphragm wafer 100 includes outer portion 102 and diaphragm 104. Outer portion 102 supports diaphragm 104, which is configured to deflect under pressure. First insulating layer 110 is positioned on a first surface of outer portion 102 and diaphragm 104. Resistor R1-R4 of Wheatstone bridge 12 are positioned on a first surface of first insulating layer 110 over diaphragm 104. Second insulating layer 112 is positioned on a first surface of first insulating layer 110 and first surfaces of resistors R1-R4 of Wheatstone bridge 12. Protection layer 114 is positioned on a first surface of second insulating layer 112.

Trim wafer 120, shown in FIG. 5B, is one embodiment of a trim wafer that can form part of trim die 82 of pressure sensor 10 shown in FIG. 3. Trim wafer 120 includes wafer portion 122. First insulating layer 130 is positioned on a first surface of wafer portion 122. Resistor RG, resistor RS, resistor RZ, and resistor RV of trim resistors 14 are positioned on a first surface of first insulating layer 130. Second insulating layer 132 is positioned on a first surface of first insulating layer 130 and first surfaces of resistor RG, resistor RS, resistor RZ, and resistor RV of trim resistors 14. Protection layer 134 is positioned on a first surface of second insulating layer 132. Resistor RG and resistor RV are matched to resistors R1-R4 of Wheatstone bridge 12 (the matched trim resistors), and resistor RS and resistor RZ are mismatched to resistors R1-R4 of Wheatstone bridge 12 (the unmatched trim resistors).

Similar components of diaphragm wafer 100 and trim wafer 120 are made out of the same materials. Outer portion 102 and diaphragm 104 of diaphragm wafer 100 are made out of the same materials as wafer portion 122 of trim wafer 120. Resistors R1-R4 of Wheatstone bridge 12 of diaphragm wafer 100 are made out of the same materials and doped to the same concentration as resistor RG and resistor RV (the matched trim resistors) of trim resistors 14 of trim wafer 120. First insulating layer 110 of diaphragm wafer 100 is made out of the same material as first insulating layer 130 of trim wafer 120. Second insulating layer 112 of diaphragm wafer 100 is made out of the same material as second insulating layer 132 of trim wafer 120. Protection layer 114 of diaphragm wafer 100 is made out of the same material as protection layer 134 of trim wafer 120.

Further, similar components of diaphragm wafer 100 and trim wafer 120 have the same thickness. Outer portion 102 of diaphragm wafer 100 has the same thickness as wafer portion 122 of trim wafer 120. Resistors R1-R4 of Wheatstone bridge 12 of diaphragm wafer 100 have the same thicknesses as resistor RG and resistor RV (the matched trim resistors) of trim resistors 14 of trim wafer 120. First insulating layer 110 of diaphragm wafer 100 has the same thickness as first insulating layer 130 of trim wafer 120. Second insulating layer 112 of diaphragm wafer 100 has the same thickness as second insulating layer 132 of trim wafer 120. Protection layer 114 of diaphragm wafer 100 has the same thickness as protection layer 134 of trim wafer 120.

Resistor RS and resistor RZ (the unmatched trim resistors) can be made out of a different material than or doped to a different concentration than resistors R1-R4 of Wheatstone bridge 12. More specifically, resistor RS and resistor RZ can be made out of a different material than or doped to a different concentration than resistors R1-R4 of Wheatstone bridge 12 so that resistor RS and resistor RZ have a different temperature coefficient of resistance than resistors R1-R4 of Wheatstone bridge 12.

Diaphragm wafer 100 and trim wafer 120 can be manufactured according to the same process to match the materials and thicknesses of similar components on diaphragm wafer 100 and trim wafer 120. Alternatively, diaphragm wafer 100 and trim wafer 120 can be manufactured using different processes that allow the materials and thicknesses of similar components of diaphragm wafer 100 and trim wafer 120 to be matched.

Having similar components of diaphragm wafer 100 and trim wafer 120 be matched allows diaphragm wafer 100 and trim wafer 120 to have the same drift characteristics. As the components of diaphragm wafer 100 and trim wafer 120 age, the output characteristics of diaphragm wafer 100 and trim wafer 120 will drift. Using the same materials and thicknesses for similar components of diaphragm wafer 100 and trim wafer 120 allows diaphragm wafer 100 and trim wafer 120 to have the same drift characteristics. This allows Wheatstone bridge 12 to stay in balance, which results in low to no output error drift.

In an alternate embodiment, trim wafer 120 can have extra layers and trim resistors 14 can be positioned on different layers. For example, resistor RG and resistor RV can be positioned on a matched doped silicon layer, and resistor RS and resistor RZ can be positioned on an unmatched Nichrome layer.

Figure 6A:
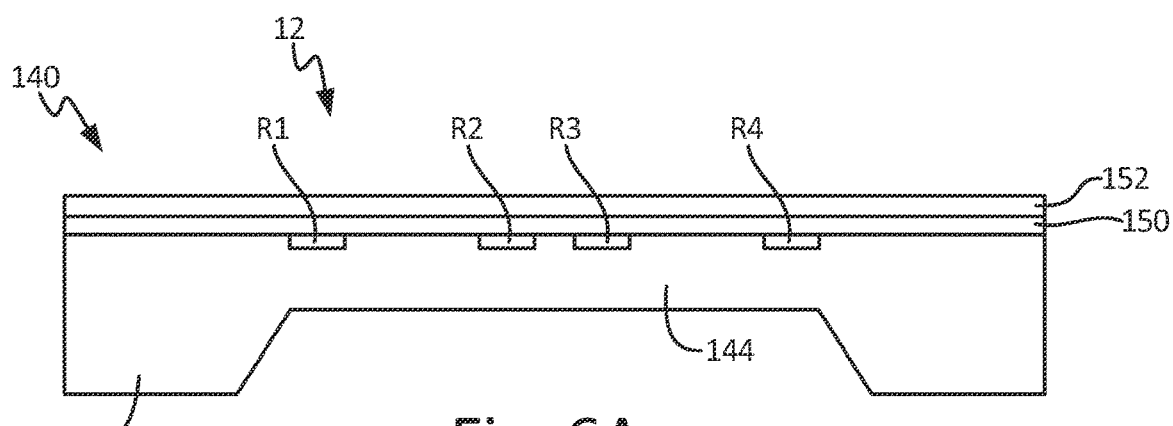
FIG. 6A is a side view of a third embodiment of a diaphragm wafer.
Figure 6B:
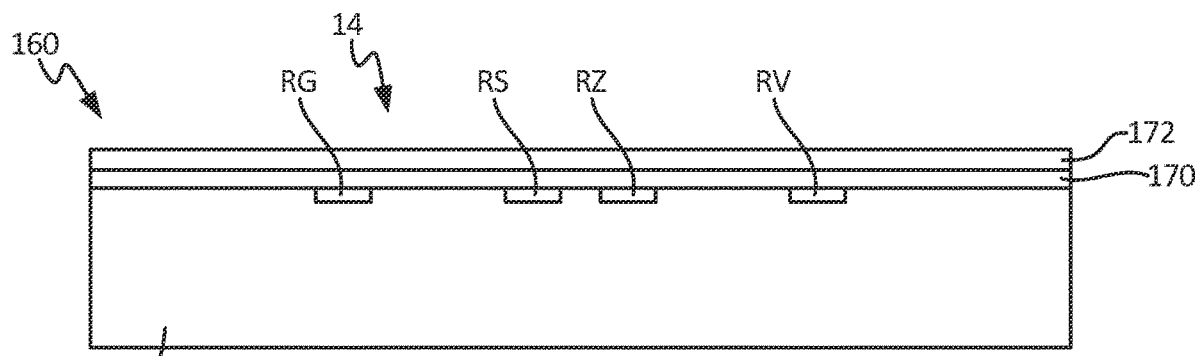
FIG. 6B is a side view of a second embodiment of a trim wafer.

FIG. 6A is a side view of diaphragm wafer 140. FIG. 6B is a side view of trim wafer 160. FIGS. 6A-6B will be discussed together below. FIG. 6A shows Wheatstone bridge 12 (including resistor R1, resistor R2, resistor R3, and resistor R4), diaphragm wafer 140 having outer portion 142 and diaphragm 144, insulating layer 150, and protection layer 152. FIG. 6B shows trim resistors 14 (including resistor RG, resistor RS, resistor RZ, and resistor RV), trim wafer 160 including wafer portion 162, insulating layer 170, and protection layer 172.

Diaphragm wafer 140 is another embodiment of diaphragm wafer 30 that can form part of pressure die 70 of pressure sensor 10 shown in FIG. 3. Diaphragm wafer 140 includes outer portion 142 and diaphragm 144. Outer portion 142 supports diaphragm 144, which is configured to deflect under pressure. Resistors R1-R4 of Wheatstone bridge 12 are positioned in a top side of diaphragm 144. Insulating layer 150 is positioned on first surfaces of outer portion 142 and diaphragm 144 and on first surfaces of resistors R1-R4 of Wheatstone bridge 12. Protection layer 152 is positioned on a first surface of insulating layer 150.

Trim wafer 160 is another embodiment of a trim wafer that can form part of trim die 82 of pressure sensor 10 shown in FIG. 3. Trim wafer 160 includes wafer portion 162. Resistor RG, resistor RS, resistor RZ, and resistor RV of trim resistors 14 are positioned in a top side of wafer portion 162. Insulating layer 170 is positioned on a first surface of wafer portion 162 and first surfaces of resistor RG, resistor RS, resistor RZ, and resistor RV of trim resistors 14. Protection layer 172 is positioned on a first surface of insulating layer 170. Resistor RG and resistor RV are matched to resistors R1-R4 of Wheatstone bridge 12 (the matched trim resistors), and resistor RS and resistor RZ are mismatched to resistors R1-R4 of Wheatstone bridge 12 (the unmatched trim resistors).

Similar components of diaphragm wafer 140 and trim wafer 160 are made out of the same materials. Outer portion 142 and diaphragm 144 of diaphragm wafer 140 are made out of the same materials as wafer portion 162 of trim wafer 160. Resistors R1-R4 of Wheatstone bridge 12 of diaphragm wafer 140 are made out of the same materials and doped to the same concentration as resistor RG and resistor RV (the matched trim resistors) of trim resistors 14 of trim wafer 160. Insulating layer 150 of diaphragm wafer 140 is made out of the same material as insulating layer 170 of trim wafer 160. Protection layer 152 of diaphragm wafer 140 is made out of the same material as protection layer 172 of trim wafer 160.

Further, similar components of diaphragm wafer 140 and trim wafer 160 have the same thickness. Outer portion 142 of diaphragm wafer 140 has the same thickness as wafer portion 162 of trim wafer 160. Resistors R1-R4 of Wheatstone bridge 12 of diaphragm wafer 140 have the same thicknesses as resistor RG and resistor RV (the matched trim resistors) of trim resistors 14 of trim wafer 160. Insulating layer 150 of diaphragm wafer 140 has the same thickness as insulating layer 170 of trim wafer 160. Protection layer 152 of diaphragm wafer 140 has the same thickness as protection layer 172 of trim wafer 160.

Resistor RS and resistor RZ (the unmatched trim resistors) can be made out of a different material than or doped to a different concentration than resistors R1-R4 of Wheatstone bridge 12. More specifically, resistor RS and resistor RZ can be made out of a different material or doped to a different concentration than resistors R1-R4 of Wheatstone bridge 12 so that resistor RS and resistor RZ have a different temperature coefficient of resistance than resistors R1-R4 of Wheatstone bridge 12.

Diaphragm wafer 140 and trim wafer 160 can be manufactured according to the same process to match the materials and thicknesses of similar components on diaphragm wafer 140 and trim wafer 160. Alternatively, diaphragm wafer 140 and trim wafer 160 can be manufactured using different processes that allow the materials and thicknesses of similar components on diaphragm wafer 140 and trim wafer 160 to be matched.

Having similar components of diaphragm wafer 140 and trim wafer 160 be matched allows diaphragm wafer 140 and trim wafer 160 to have the same drift characteristics. As the components of diaphragm wafer 140 and trim wafer 160 age, the output characteristics of diaphragm wafer 140 and trim wafer 160 will drift. Using the same materials and thicknesses for similar components of diaphragm wafer 140 and trim wafer 160 allows diaphragm wafer 140 and trim wafer 160 to have the same drift characteristics. This allows Wheatstone bridge 12 to stay in balance, which results in low to no output error drift.

In an alternate embodiment, trim wafer 160 can have extra layers and trim resistors 14 can be positioned on different layers. For example, resistor RG and resistor RV can be positioned on a matched doped silicon layer, and resistor RS and resistor RZ can be positioned on an unmatched Nichrome layer.

Discussion of Possible Embodiments

The following are non-exclusive descriptions of possible embodiments of the present invention.

A pressure sensor includes a Wheatstone bridge circuit including a first resistor, a second resistor, a third resistor, and a fourth resistor having matching output characteristics. The pressure sensor further includes a first trim resistor in series with the Wheatstone bridge circuit, wherein the first trim resistor has output characteristics matching the output characteristics of the first resistor, the second resistor, the third resistor, and the fourth resistor of the Wheatstone bridge. The pressure sensor additionally includes a second trim resistor in parallel or a parallel loop with the Wheatstone bridge circuit, wherein the second trim resistor has output characteristics matching the output characteristics of the first resistor, the second resistor, the third resistor, and the fourth resistor of the Wheatstone bridge.

The pressure sensor of the preceding paragraph can optionally include, additionally and/or alternatively, any one or more of the following features, configurations and/or additional components:

Two of the first resistor, the second resistor, the third resistor, and the fourth resistor are oriented to increase in resistance due to an applied pressure, and two of the first resistor, the second resistor, the third resistor, and the fourth resistor are oriented to decrease in resistance due to the applied pressure.

The first trim resistor and the second trim resistor have a temperature coefficient of resistance that is the same as a temperature coefficient of resistance of the first resistor, the second resistor, the third resistor, and the fourth resistor.

The first trim resistor and the second trim resistor are made out of the same material and/or have the same thickness as the first resistor, the second resistor, the third resistor, and the fourth resistor of the Wheatstone bridge.

The first trim resistor can be trimmed to change a span of the Wheatstone bridge circuit, and the second trim resistor can be trimmed to change a nominal voltage output of the Wheatstone bridge circuit.

The pressure sensor further includes a third trim resistor in series with the Wheatstone bridge circuit, wherein the third trim resistor has output characteristics that are mismatched to the output characteristics of the first resistor, the second resistor, the third resistor, and the fourth resistor of the Wheatstone bridge, and a fourth trim resistor in parallel with the Wheatstone bridge circuit, wherein the fourth trim resistor has output characteristics that are mismatched to the output characteristics of the first resistor, the second resistor, the third resistor, and the fourth resistor of the Wheatstone bridge.

The third trim resistor and the fourth trim resistor have a temperature coefficient of resistance that is different than a temperature coefficient of resistance of the first resistor, the second resistor, the third resistor, and the fourth resistor.

The first resistor, the second resistor, the third resistor, and the fourth resistor of the Wheatstone bridge are positioned on a pressure die, and the first trim resistor, the second trim resistor, the third trim resistor, and the fourth trim resistor are positioned on a trim die separate from the pressure die.

A pressure sensor includes a Wheatstone bridge circuit including a first resistor, a second resistor, a third resistor, and a fourth resistor having matching output characteristics. The pressure sensor further includes a first trim resistor electrically coupled to the Wheatstone bridge circuit, wherein the first trim resistor has output characteristics matching the output characteristics of the first resistor, the second resistor, the third resistor, and the fourth resistor of the Wheatstone bridge. The pressure sensor additionally includes a second trim resistor electrically coupled to the Wheatstone bridge circuit, wherein the second trim resistor has output characteristics that are mismatched to the output characteristics of the first resistor, the second resistor, the third resistor, and the fourth resistor of the Wheatstone bridge.

The pressure sensor of the preceding paragraph can optionally include, additionally and/or alternatively, any one or more of the following features, configurations and/or additional components:

The first trim resistor has a temperature coefficient of resistance that is the same as a temperature coefficient of resistance as the first resistor, the second resistor, the third resistor, and the fourth resistor, and the second trim resistor has a temperature coefficient of resistance that is different than the temperature coefficient of resistance as the first resistor, the second resistor, the third resistor, and the fourth resistor.

The first trim resistor is made out of the same material and/or has the same thickness as the first resistor, the second resistor, the third resistor, and the fourth resistor of the Wheatstone bridge.

The first trim resistor can be trimmed to change a span or a nominal voltage output of the Wheatstone bridge circuit, and the second trim resistor can be trimmed to temperature compensate a span or a nominal voltage output of the Wheatstone bridge circuit.

The first resistor, the second resistor, the third resistor, and the fourth resistor of the Wheatstone bridge are positioned on a pressure die, and the first trim resistor and the second trim resistor are positioned on a trim die separate from the pressure die.

A pressure sensor includes a first sensor portion having a pressure die with piezoresistors located in a Wheatstone bridge configuration, and a second sensor portion having a trim die with a first trim resistor positioned on the trim die. The pressure die in the first sensor portion is electrically coupled to the trim die in the second sensor portion. The first sensor portion and the second portion are positioned apart from one another.

The pressure sensor of the preceding paragraph can optionally include, additionally and/or alternatively, any one or more of the following features, configurations and/or additional components:

The first sensor portion further includes a housing, and a cavity extending from a first end to a second end of the housing, wherein the pressure die is positioned in a first cavity portion of the cavity and surrounded by a pressure transfer fluid to hermetically seal the pressure die in the first sensor portion.

The pressure die further includes a diaphragm wafer having an outer portion and a diaphragm, a first insulating layer on first surfaces of the outer portion and the diaphragm, wherein the piezoresistors of the Wheatstone bridge are positioned on a first surface of the first insulating layer over the diaphragm, a second insulating layer on a first surface of the first insulating layer and first surfaces of the piezoresistors of the Wheatstone bridge, and a protection layer on a first surface of the second insulating layer. The trim die further includes a trim wafer having a wafer portion, a first insulating layer on a first surface of the wafer portion, wherein the first trim resistor is positioned on a first surface of the first insulating layer, a second insulating layer on a first surface of the first insulating layer and a first surface of the first trim resistor, and a protection layer on a first surface of the second insulating layer. The outer portion and the diaphragm of the diaphragm wafer are made out of the same material as the wafer portion of the trim wafer. The first insulating layer of the diaphragm wafer is made out of the same material and/or has the same thickness as the first insulating layer of the wafer portion. The piezoresistors of the Wheatstone bridge on the diaphragm wafer are made out of the same material and/or have the same thickness as the first trim resistor on the wafer portion. The second insulating layer of the diaphragm wafer is made out of the same material and/or has the same thickness as the second insulating layer of the wafer portion. The protection layer of the diaphragm wafer is made out of the same material and/or has the same thickness as the protection layer of the wafer portion.

The pressure die further includes a diaphragm wafer having an outer portion and a diaphragm, wherein the piezoresistors of the Wheatstone bridge are positioned in the diaphragm, an insulating layer on first surfaces of the outer portion and the diaphragm and first surfaces of the piezoresistors of the Wheatstone bridge, and a protection layer on a first surface of the insulating layer. The trim die further includes a trim wafer having a wafer portion, wherein the first trim resistor is positioned in the wafer portion, an insulating layer on a first surface of the wafer portion and a first surface of the first trim resistor, and a protection layer on a first surface of the insulating layer. The outer portion and the diaphragm of the diaphragm wafer are made out of the same material as the wafer portion of the trim wafer. The piezoresistors of the Wheatstone bridge on the diaphragm wafer are made out of the same material and/or have the same thickness as the first trim resistor on the wafer portion. The insulating layer of the diaphragm wafer is made out of the same material and/or has the same thickness as the insulating layer of the wafer portion. The protection layer of the diaphragm wafer is made out of the same material and/or has the same thickness as the protection layer of the wafer portion.

The trim die is manufactured using the same process as the pressure die.

The first trim resistor has a temperature coefficient of resistance that is the same as a temperature coefficient of resistance of the Wheatstone bridge.

The first trim resistor has a temperature coefficient of resistance that is different than a temperature coefficient of resistance of the Wheatstone bridge.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A pressure sensor comprising:
  a Wheatstone bridge circuit including a first resistor, a second resistor, a third resistor, and a fourth resistor having matching output characteristics;
  a first trim resistor in series with the Wheatstone bridge circuit, wherein the first trim resistor has output characteristics matching the output characteristics of the first resistor, the second resistor, the third resistor, and the fourth resistor of the Wheatstone bridge circuit; and
  a second trim resistor in parallel or a parallel loop with the Wheatstone bridge circuit, wherein the second trim resistor has output characteristics matching the output characteristics of the first resistor, the second resistor, the third resistor, and the fourth resistor of the Wheatstone bridge circuit; and
  a third trim resistor in series with the Wheatstone bridge circuit, wherein the third trim resistor has output characteristics that are mismatched to the output characteristics of the first resistor, the second resistor, the third resistor, and the fourth resistor of the Wheatstone bridge circuit.

2. The pressure sensor of claim 1, wherein two of the first resistor, the second resistor, the third resistor, and the fourth resistor are oriented to increase in resistance due to an applied pressure, and two of the first resistor, the second resistor, the third resistor, and the fourth resistor are oriented to decrease in resistance due to the applied pressure.

3. The pressure sensor of claim 1, wherein the first trim resistor and the second trim resistor have a temperature coefficient of resistance that is the same as a temperature coefficient of resistance of the first resistor, the second resistor, the third resistor, and the fourth resistor.

4. The pressure sensor of claim 1, wherein the first trim resistor and the second trim resistor are made out of the same material and/or have the same thickness as the first resistor, the second resistor, the third resistor, and the fourth resistor of the Wheatstone bridge circuit.

5. The pressure sensor of claim 1, wherein the first trim resistor can be trimmed to change a span of the Wheatstone bridge circuit, and wherein the second trim resistor can be trimmed to change a nominal voltage output of the Wheatstone bridge circuit.

6. The pressure sensor of claim 1, and further comprising:
  a fourth trim resistor in parallel with the Wheatstone bridge circuit, wherein the fourth trim resistor has output characteristics that are mismatched to the output characteristics of the first resistor, the second resistor, the third resistor, and the fourth resistor of the Wheatstone bridge circuit.

7. The pressure sensor of claim 6, wherein the third trim resistor and the fourth trim resistor have a temperature coefficient of resistance that is different than a temperature coefficient of resistance of the first resistor, the second resistor, the third resistor, and the fourth resistor.

8. The pressure sensor of claim 6, wherein the first resistor, the second resistor, the third resistor, and the fourth resistor of the Wheatstone bridge circuit are positioned on a pressure die, and wherein the first trim resistor, the second trim resistor, the third trim resistor, and the fourth trim resistor are positioned on a trim die separate from the pressure die.

9. A pressure sensor comprising:
a Wheatstone bridge circuit including a first resistor, a second resistor, a third resistor, and a fourth resistor having matching output characteristics;
a first trim resistor electrically coupled to the Wheatstone bridge circuit, wherein the first trim resistor has output characteristics matching the output characteristics of the first resistor, the second resistor, the third resistor, and the fourth resistor of the Wheatstone bridge circuit; and
a second trim resistor electrically coupled to the Wheatstone bridge circuit, wherein the second trim resistor has output characteristics that are mismatched to the output characteristics of the first resistor, the second resistor, the third resistor, and the fourth resistor of the Wheatstone bridge circuit.

10. The pressure sensor of claim 9, wherein the first trim resistor has a temperature coefficient of resistance that is the same as a temperature coefficient of resistance as the first resistor, the second resistor, the third resistor, and the fourth resistor, and wherein the second trim resistor has a temperature coefficient of resistance that is different than the temperature coefficient of resistance as the first resistor, the second resistor, the third resistor, and the fourth resistor.

11. The pressure sensor of claim 9, wherein the first trim resistor is made out of the same material and/or has the same thickness as the first resistor, the second resistor, the third resistor, and the fourth resistor of the Wheatstone bridge circuit.

12. The pressure sensor of claim 9, wherein the first trim resistor can be trimmed to change a span or a nominal voltage output of the Wheatstone bridge circuit, and wherein the second trim resistor can be trimmed to temperature compensate a span or a nominal voltage output of the Wheatstone bridge circuit.

13. The pressure sensor of claim 9, wherein the first resistor, the second resistor, the third resistor, and the fourth resistor of the Wheatstone bridge circuit are positioned on a pressure die, and wherein the first trim resistor and the second trim resistor are positioned on a trim die separate from the pressure die.

14. A pressure sensor comprising:
a first sensor portion having a pressure die with piezoresistors located in a Wheatstone bridge circuit configuration; and
a second sensor portion having a trim die with a first trim resistor positioned on the trim die;
wherein the pressure die in the first sensor portion is electrically coupled to the trim die in the second sensor portion; and
wherein the first sensor portion and the second portion are positioned apart from one another.

15. The pressure sensor of claim 14, wherein the first sensor portion further comprises:
a housing; and
a cavity extending from a first end to a second end of the housing;
wherein the pressure die is positioned in a first cavity portion of the cavity and surrounded by a pressure transfer fluid to hermetically seal the pressure die in the first sensor portion.

16. The pressure sensor of claim 14,
wherein the pressure die further comprises:
a diaphragm wafer having an outer portion and a diaphragm;
a first insulating layer on first surfaces of the outer portion and the diaphragm, wherein the piezoresistors of the Wheatstone bridge circuit are positioned on a first surface of the first insulating layer over the diaphragm;
a second insulating layer on a first surface of the first insulating layer and first surfaces of the piezoresistors of the Wheatstone bridge circuit; and
a protection layer on a first surface of the second insulating layer; wherein the trim die further comprises:
a trim wafer having a wafer portion;
a first insulating layer on a first surface of the wafer portion, wherein the first trim resistor is positioned on a first surface of the first insulating layer;
a second insulating layer on a first surface of the first insulating layer and a first surface of the first trim resistor; and
a protection layer on a first surface of the second insulating layer;
wherein the outer portion and the diaphragm of the diaphragm wafer are made out of the same material as the wafer portion of the trim wafer;
wherein the first insulating layer of the diaphragm wafer is made out of the same material and/or has the same thickness as the first insulating layer of the wafer portion;
wherein the piezoresistors of the Wheatstone bridge circuit on the diaphragm wafer are made out of the same material and/or have the same thickness as the first trim resistor on the wafer portion;
wherein the second insulating layer of the diaphragm wafer is made out of the same material and/or has the same thickness as the second insulating layer of the wafer portion; and/or
wherein the protection layer of the diaphragm wafer is made out of the same material and/or has the same thickness as the protection layer of the wafer portion.

17. The pressure sensor of claim 14,
wherein the pressure die further comprises:
a diaphragm wafer having an outer portion and a diaphragm, wherein the piezoresistors of the Wheatstone bridge circuit are positioned in the diaphragm;
an insulating layer on first surfaces of the outer portion and the diaphragm and first surfaces of the piezoresistors of the Wheatstone bridge circuit; and
a protection layer on a first surface of the insulating layer;
wherein the trim die further comprises:
a trim wafer having a wafer portion, wherein the first trim resistor is positioned in the wafer portion;
an insulating layer on a first surface of the wafer portion and a first surface of the first trim resistor; and
a protection layer on a first surface of the insulating layer;
wherein the outer portion and the diaphragm of the diaphragm wafer are made out of the same material as the wafer portion of the trim wafer;
wherein the piezoresistors of the Wheatstone bridge circuit on the diaphragm wafer are made out of the same material and/or have the same thickness as the first trim resistor on the wafer portion;
wherein the insulating layer of the diaphragm wafer is made out of the same material and/or has the same thickness as the insulating layer of the wafer portion; and/or
wherein the protection layer of the diaphragm wafer is made out of the same material and/or has the same thickness as the protection layer of the wafer portion.

18. The pressure sensor of claim 14, wherein the trim die is manufactured using the same process as the pressure die.

19. The pressure sensor of claim 14, wherein the first trim resistor has a temperature coefficient of resistance that is the same as a temperature coefficient of resistance of the Wheatstone bridge circuit.

20. The pressure sensor of claim 14, wherein the first trim resistor has a temperature coefficient of resistance that is different than a temperature coefficient of resistance of the Wheatstone bridge circuit.

* * * * *